(12) United States Patent
Lee et al.

(10) Patent No.: US 7,595,519 B2
(45) Date of Patent: Sep. 29, 2009

(54) IMAGE SENSOR AND METHOD OF MANUFACTURING THE SAME

(75) Inventors: Jong-Jin Lee, Seoul (KR); Yo-Han Sun, Suson-si (KR); Tae-Seok Oh, Seoul (KR); Sung-Jae Joo, Seongnam-si (KR); Bum-Suk Kim, Seoul (KR); Yun-Ho Jang, Seoul (KR); Sae-Young Kim, Suwon-si (KR); Keun-Chan Yuk, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 276 days.

(21) Appl. No.: 11/682,550

(22) Filed: Mar. 6, 2007

(65) Prior Publication Data

US 2007/0210359 A1 Sep. 13, 2007

(30) Foreign Application Priority Data

Mar. 7, 2006 (KR) ...................... 10-2006-0021286

(51) Int. Cl.
*H01L 31/062* (2006.01)
(52) U.S. Cl. .................. 257/290; 257/223; 257/230; 257/445; 257/E27.139; 257/E27.145; 438/57; 438/79
(58) Field of Classification Search ................. 257/290, 257/E27.139, 223, 230, 445, E27.145, E27.162; 438/57, 59
See application file for complete search history.

(56) References Cited

U.S. PATENT DOCUMENTS

| | | | | |
|---|---|---|---|---|
| 5,898,195 | A | * | 4/1999 | Harada ........................ 257/223 |
| 6,140,147 | A | * | 10/2000 | Murakami et al. ............. 438/79 |
| 2007/0108371 | A1 | * | 5/2007 | Stevens et al. ........... 250/214.1 |

FOREIGN PATENT DOCUMENTS

JP 9-331058 12/1997

OTHER PUBLICATIONS

English Abstract Publication No. 09-331058.
Korean Office Action 10-2006-0021286; 9-5-2007-067544919.

* cited by examiner

*Primary Examiner*—Tu-Tu V Ho
(74) *Attorney, Agent, or Firm*—F. Chau & Associates, LLC

(57) ABSTRACT

An image sensor includes a first type semiconductor layer, a second type semiconductor layer and a first type well. The first type semiconductor layer is formed on a semiconductor substrate and includes a plurality of pixels which receive external light and convert optical charges into an electrical signal. The second type semiconductor layer is supplied with a drain voltage to have a potential different from that of the first semiconductor layer, and the first type well controls a power source voltage (VDD) using the drain voltage.

24 Claims, 3 Drawing Sheets

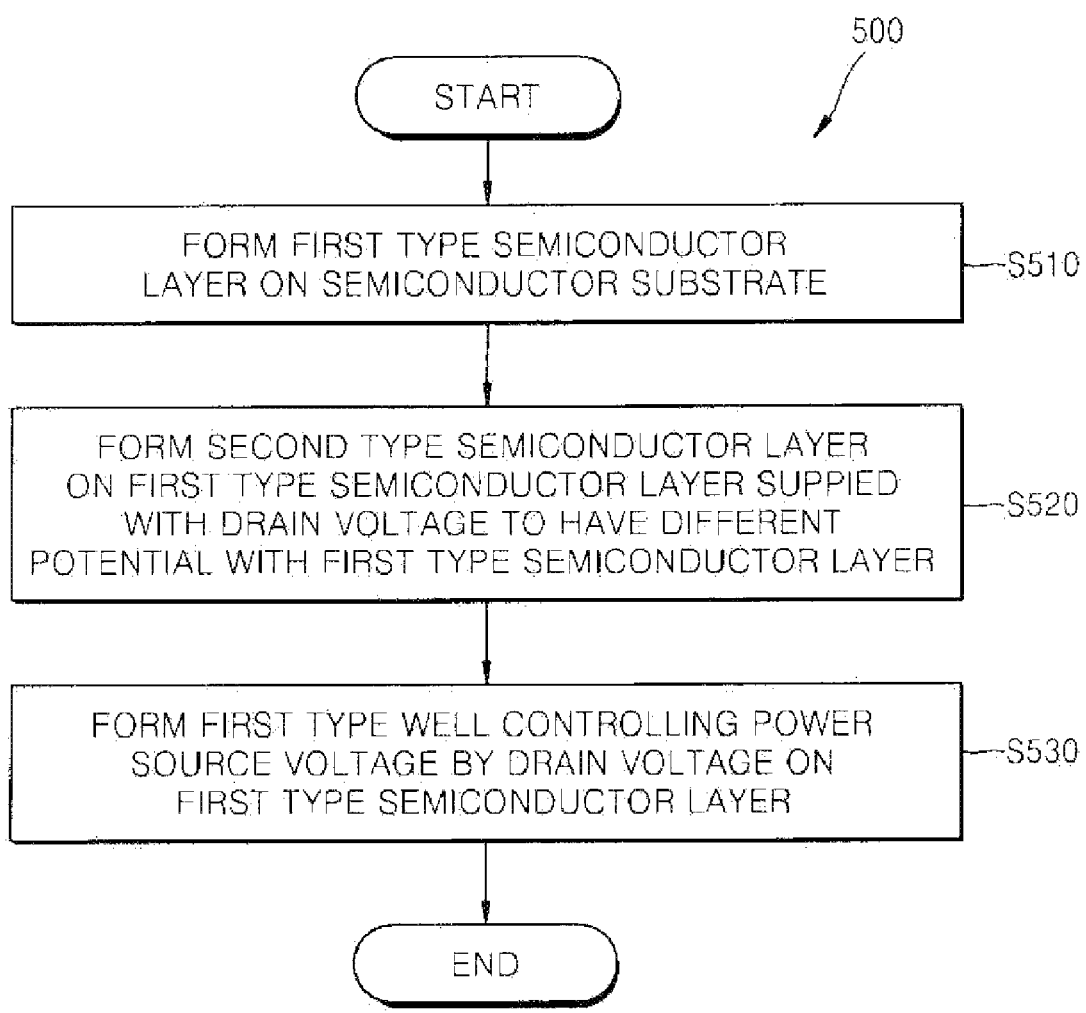

IMAGE SENSOR AND METHOD OF MANUFACTURING THE SAME

CROSS-REFERENCE TO RELATED PATENT APPLICATION

This application claims priority to Korean Patent Application No. 10-2006-0021286, filed on Mar. 7, 2006, the disclosure of which is hereby incorporated by reference herein in its entirety.

BACKGROUND OF THE INVENTION

1. Technical Field

The present disclosure relates to an image sensor and to a method of manufacturing the same, and more particularly, to an image sensor which may simultaneously control sensitivity and color mixing characteristics and to a method of manufacturing the same.

2. Description of the Related Art

Image devices may be defined as photoelectric conversion elements that monitor light to convert it into an electrical signal. FIG. 1 schematically illustrates an image sensor according to a conventional technique.

Referring to FIG. 1, a conventional image sensor 10 includes a plurality of pixels (not shown) arranged as a matrix on a P-type epitaxial layer 13. Each pixel includes a photodiode PD and transistors (not shown). The photodiode PD monitors external light and generates optical charges. The generated optical charges are then gathered in the photodiode PD. Next, the transistors provide an electrical signal according to the generated optical charges.

However, the depth of a region where the photodiode PD may gather electrons is restricted. For example, electrons generated in a region deeper than the gatherable region may cause a crosstalk phenomenon to occur. The crosstalk phenomenon may occur when optical charges generated in a semiconductor layer of a semiconductor substrate do not migrate to a photodiode of a corresponding pixel but instead migrate to a photodiode of a neighboring pixel. The above-mentioned crosstalk may in turn degrade the color reproducibility of the image sensor.

The crosstalk phenomenon is now even more significant as a result of the current tendency toward increasing the integration of the image sensors. For example, as a result of the increasing integration of the image sensors, the distance between pixels may become shortened, and the dimensions of the photodiode of these image sensors may be decreased, which in turn may increase the probability that, the optical charges generated in the semiconductor layer of the semiconductor substrate may migrate to a photodiode of a neighboring pixel.

Thus, to overcome the above-mentioned crosstalk phenomenon, a conventional image sensor was developed and will be explained in further detail below. The conventional image sensor 10 includes an Ndrain layer 12 under the pixel array (not shown) to externally drain electrons having a color mixing component. Moreover, to externally drain the color mixing component, a power source voltage VDD is supplied to the Ndrain layer 12 of the image sensor 10.

In addition, to supply the power source voltage VDD to the Ndrain layer 12, the image sensor 10 has a power source connection element 14 that electrically connects the Ndrain layer 12 to the power source voltage VDD.

FIG. 2 is a graph representing a potential formed along a dotted line X-X' of FIG. 1.

Referring to FIGS. 1 and 2, by supplying the power source voltage VDD to the Ndrain layer 12, an energy barrier such as a region b is formed to solve the difficulty that results from the crosstalk phenomenon caused by migration of an optical charge ($e^-$) to another pixel.

However, because with the conventional image sensor, the voltage is overly applied to the drain layer 12 to drain the color mixing component that causes the crosstalk, a signal component may also be drained. Consequently, the sensitivity characteristics of the image sensor may also be adversely degraded. In other words, the sensitivity characteristics of the conventional image sensor may have to be sacrificed in order to prevent the color mixing phenomenon caused by the crosstalk.

SUMMARY OF THE INVENTION

The exemplary embodiments of the present invention provide an image sensor that controls color mixing/sensitivity characteristics.

The exemplary embodiments of the present invention also provide a method of manufacturing an image sensor that controls color mixing/sensitivity characteristics.

In accordance with an exemplary embodiment of the present invention, an image sensor is provided. The image sensor includes a first type semiconductor layer, a second type semiconductor layer and a first type well.

The first type semiconductor layer is formed on a semiconductor substrate and includes a plurality of pixels which receive external light and convert optical charges into an electrical signal. The second type semiconductor layer is supplied with a drain voltage to have a potential different from that of the first semiconductor layer, and the first type well controls a power source voltage (VDD) using the drain voltage.

The first type semiconductor layer may be a P-type semiconductor layer, the second type semiconductor layer may be an N+ type semiconductor layer, and the first type well may be a P-type well.

The first type well is formed in a lower portion of the pixel of the first semiconductor layer. Also, the first type well may be ion implanted.

The image sensor may have the drain voltage varied in accordance with an implantation energy of the first type well. The image sensor controls the signal sensitivity and color mixing characteristics of the electrical signal in accordance with the drain voltage.

Furthermore, the first type well controls the drain voltage to be lower than the power source voltage (VDD).

The image sensor further includes a power source connection element that electrically connects the power source voltage (VDD) to the second type semiconductor layer. The power source connection element is electrically connected to the first type well, and is spaced apart from the second semiconductor layer by a regular distance. The power source connection element may be formed by ion implantation, and be implanted with an N-type impurity.

The second type semiconductor layer may be formed on the first type semiconductor layer, and may be formed by doping. The image sensor may be a complementary metal oxide semiconductor (CMOS) image sensor.

In accordance with an exemplary embodiment of the present invention, a method of manufacturing an image sensor is provided. The method includes forming a first type semiconductor layer that has a plurality of pixels which receive external light and convert optical charges into an electrical signal on a semiconductor substrate, and forming a second type semiconductor layer supplied with a drain voltage to have a potential different from that of the first type semiconductor layer. The method further includes forming a first type well to control a power source voltage (VDD) using the drain voltage.

The first type semiconductor layer may be a P-type semiconductor layer, and the second type semiconductor layer may be an N+ type semiconductor layer. Also, the first type well may be a P-type well. The first type well is formed in a lower portion of the pixel of the first type semiconductor layer, and ion implanted.

The drain voltage is varied in accordance with an implantation energy of the first type well. Also, the image sensor controls the signal sensitivity and color mixing characteristics of the electrical signal according to the drain voltage. The first type well controls the drain voltage to be lower than the power source voltage (VDD).

The method may further include forming a power source connection element for electrically connecting the power source voltage (VDD) to the second type semiconductor layer. The power source connection element is electrically connected to the first type well, and is spaced apart from the second semiconductor layer by a regular distance. The power source connection element may be formed by ion implantation, and implanted with an N-type impurity.

In accordance with another exemplary embodiment of the present invention, an image sensor is provided. The image sensor includes a first type semiconductor layer including a plurality of pixels which receive external light and convert optical charges into an electrical signal and which is formed on a semiconductor substrate, a second type semiconductor layer supplied with a drain voltage to have a potential different from that of the first semiconductor layer and which is formed on the first type semiconductor layer and a first type well controlling a power source voltage (VDD) using the drain voltage and which is formed on the first type semiconductor layer.

BRIEF DESCRIPTION OF THE DRAWINGS

Exemplary embodiments of the present invention can be understood in more detail from the following description taken in conjunction with the attached drawings in which:

FIG. 5 is a flow chart illustrating a method of manufacturing the image sensor according to an exemplary embodiment of the present invention.

DETAILED DESCRIPTION OF THE EXEMPLARY EMBODIMENTS

Figure 1:
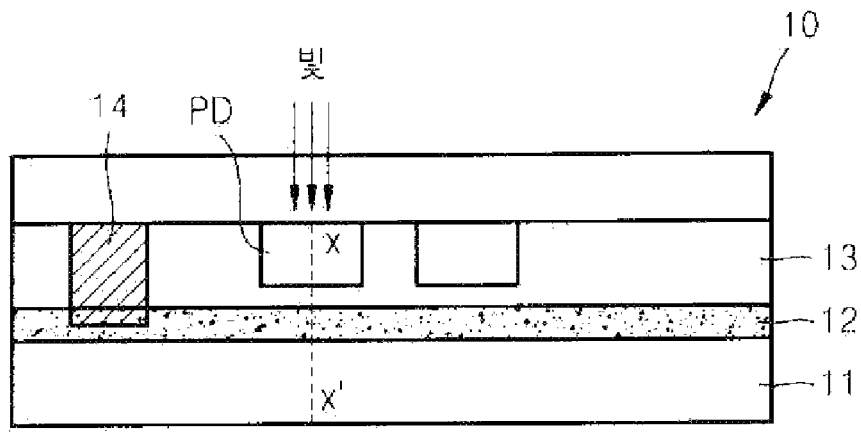
FIG. 1 schematically illustrates an image sensor according to a conventional technique.

The present invention will now be described more fully with reference to the accompanying drawings, in which exemplary embodiments of the invention are shown. The invention may, however, be embodied in many different forms and should not be construed as being limited to the exemplary embodiments set forth herein. Like reference numerals in the drawings denote like elements.

Figure 3:
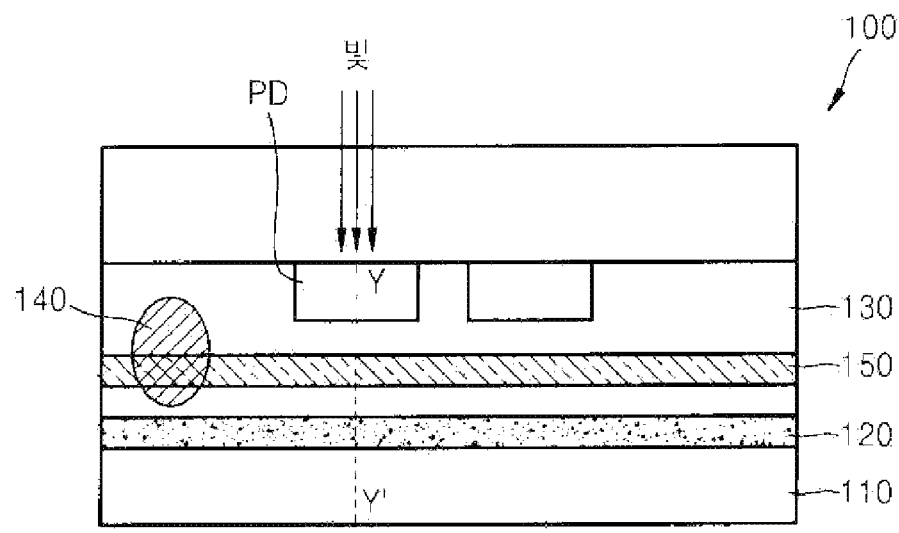
FIG. 3 schematically illustrates an image sensor according to an exemplary embodiment of the present invention.

FIG. 3 schematically illustrates an image sensor according to an exemplary embodiment of the present invention.

Referring to FIG. 3, an image sensor 100 according to an exemplary embodiment of the present invention includes a first type semiconductor layer 130, a second type semiconductor layer 120, and a first type well 150, The image sensor 100 according to exemplary embodiments of the present invention may be a complementary metal oxide semiconductor (CMOS) image sensor.

The first type semiconductor layer 130 includes pixels that monitor external light to convert optical charges into an electrical signal, and is formed on a semiconductor substrate 110. The first type semiconductor layer 130 may be a P-type epitaxial layer.

The P-type epitaxial layer 130 includes a plurality of pixels arranged as a matrix. Each pixel has a photodiode PD and transistors. The photodiode PD monitors external light, and generates optical charges. The generated optical charges are gathered on the photodiode PD. The transistors provide an electrical signal according to the generated optical charges.

The second type semiconductor layer 120 is supplied with a drain voltage to have a potential different from that of the first type semiconductor layer 130. That is, the second type semiconductor layer 120 has a potential higher than that of the first type semiconductor layer 130 as high as the drain voltage. The second type semiconductor layer 120 may be, for example, an N+ type semiconductor layer. The second type semiconductor layer 120 is doped to the first type semiconductor layer 130.

Again referring to FIG. 3, the image sensor 100 further has a power source connection element 140. The power source connection element 140 electrically connects the power source voltage VDD to the second type semiconductor layer 120. The power source connection element 140 is electrically connected to the first type well 150, and is spaced apart from the second type semiconductor layer 120 by a regular distance. The power source connection element 140 is obtained by implanting and diffusing an N-type impurity.

The first type well 150 controls the power source voltage VDD supplied to the power source connection element 140 using the drain voltage. The first type welt 150 may be, for example, a P-type well (hereinafter referred to as a deep P-well (DPW)). The DPW 150 is formed under the pixel of the first type semiconductor layer 130. The DPW 150 is, for example, formed by ion implantation.

That is, in the image sensor 100 according to the current exemplary embodiment of the present invention, the N-type doping is not solely performed from a surface of silicon to the semiconductor layer 120, but the DPW 150 is implanted in the middle of them for the purpose of voltage drop to supply the voltage to the second semiconductor layer 120 via the power source connection element 140. In this case, with the image sensor 100 according to exemplary embodiments of the present invention, the DPW 150 is not subjected to mask processing, thereby forming the DPW 150 without adding new processing.

In this case, the drain voltage is varied in accordance with an implantation energy of the DPW 150. The DPW 150 controls the drain voltage to be lower then the power source voltage VDD. According to the implantation energy of the DPW 150, ion density of an ion plug that is the power source connection element 140 is adjusted to control the drain voltage.

Figure 4:
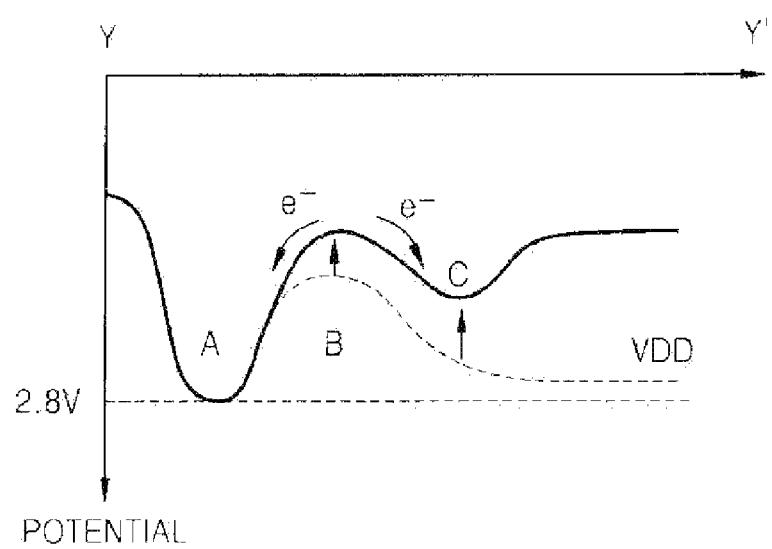
FIG. 4 is a graph representing a potential formed along a dotted line Y-Y' of FIG. 3.

FIG. 4 is a graph representing a potential formed along a dotted line Y-Y' of FIG. 3.

Referring to FIGS. 3 and 4, the image sensor 100 includes the second type semiconductor layer 120 with the drain voltage, thereby forming an energy barrier as a region B. Therefore, crosstalk (color mixing phenomenon) occurring due to optical charges e transferred to a neighboring pixel can be prevented. Also, dissimilar to FIG. 2 there is a region C formed by applying the drain voltage lower than the power source voltage VDD to the second type semiconductor layer 120.

Figure 2:
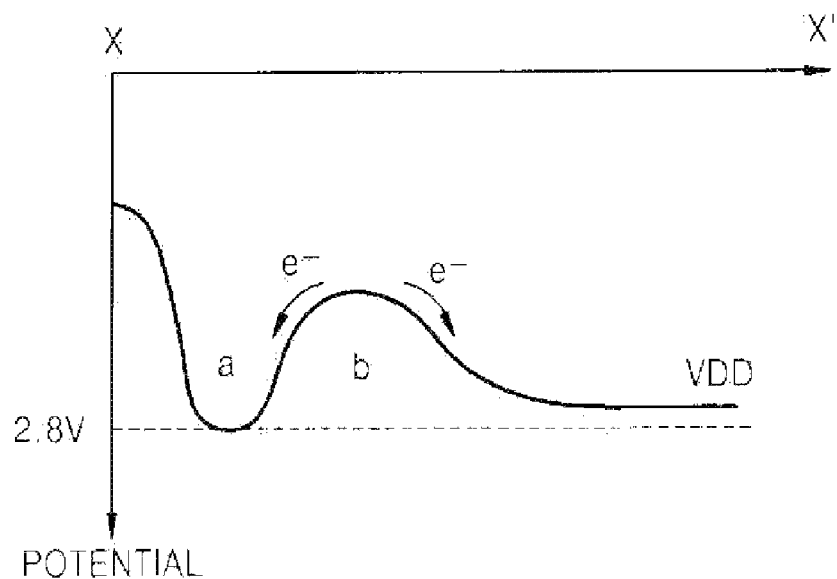
FIG. 2 is a graph representing a potential formed along a doted line X-X' of FIG. 1.

In other words, the graph illustrated in FIG. 4 is moved in a direction of an arrow as compared with the dot-lined graph of FIG. 2. In this case, the sensitivity characteristic improves as the potential of the region B is lowered. Also, the color mixing characteristic improves as the potential of the region C is raised. Consequently, as compared with the conventional image sensor 10 of FIG. 1, the image sensor 100 according to exemplary embodiments of the present invention has improved sensitivity characteristics while only slightly decreasing the coloring mixing characteristic by lowering the drain voltage.

That is, the sensitivity and the color mixing characteristic of the image sensor 100 may be controlled in accordance with the drain voltage. The sensitivity/color mixing characteristics of the image sensor 100 according to the drain voltage can be recognized by the following [Table 1].

TABLE 1

| DPW energy (MeV) | Drain Voltage (V) | Signal Sensitivity (10-8 V) | Color Mixing |
|---|---|---|---|
| 1.6 | 0 | 6.63 | 0.44 |
| 1.8 | 2.8 | 5.91 | 0.02 |
| 2.0 | 2.79 | 6.20 | 0.05 |
| 2.2 | 1.84 | 6.44 | 0.12 |

Referring to [Table 1], it can be noted that the drain voltage is varied in accordance with the DPW energy. The DPW energy is the implantation energy. Also, as the drain voltage is lowered, the color mixing characteristic is degraded (exclusive of zero drain voltage). Whereas, as the drain voltage is lower, the sensitivity characteristic improves.

Therefore, the DPW is formed by varying the DPW energy, so that a user can obtain an image sensor having desired sensitivity/coloring mixing characteristics. Furthermore, the DPW is formed by differing the DPW energy in the image sensor according to exemplary embodiments of the present invention. Thus, the ratio of drained electrons and crosstalk electrons can be controlled during processing.

FIG. 5 is a flow chart illustrating a method of manufacturing the image sensor according to an exemplary embodiment of the present invention.

Referring to FIG. 5, a method 500 of manufacturing the image sensor includes forming a first type semiconductor layer having pixels that monitor external light to convert optical charges into an electrical signal on a semiconductor substrate (S510). Then, a second type semiconductor layer with a potential different from that of the first type semiconductor layer by receiving a drain voltage is formed on the first type semiconductor layer (S520). Thereafter, a first type well that controls the power source voltage VDD using the drain voltage is formed on the first semiconductor layer (S530).

The method 500 of manufacturing the image sensor may further include forming a power source connection element that electrically connects the power source voltage VDD to the second type semiconductor layer.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An image sensor comprising:
   a first type semiconductor layer including a plurality of pixels which receive external light and convert optical charges into an electrical signal, the first type semiconductor layer is formed on a semiconductor substrate;
   a second type semiconductor layer supplied with a drain voltage to have a potential different from that of the first type semiconductor layer;
   a first type well controlling a power source voltage (VDD) using the drain voltage; and
   a power source connection element for electrically connecting the power source voltage (VDD) to the second type semiconductor layer.

2. The image sensor of claim 1, wherein the first type semiconductor layer is a P-type semiconductor layer, the second type semiconductor layer is an N+ type semiconductor layer, and the first type well is a P-type well.

3. The image sensor of claim 1, wherein the first type well is formed in a lower portion of the pixel of the first type semiconductor layer.

4. The image sensor of claim 1, wherein the first type well is formed by ion implantation.

5. The image sensor of claim 4, wherein the drain voltage is varied in accordance with an implantation energy of the first type well.

6. The image sensor of claim 5, wherein signal sensitivity and color mixing characteristics of the electrical signal are controlled in accordance with the drain voltage.

7. The image sensor of claim 5, wherein the first type well controls the drain voltage to be lower than the power source voltage (VDD).

8. The image sensor of claim 1, wherein the power source connection element is electrically connected to the first type well, and is spaced apart from the second type semiconductor layer.

9. The image sensor of claim 1, wherein the power source connection element is formed by ion implantation.

10. The image sensor of claim 9, wherein the power source connection element is implanted with an N-type impurity.

11. The image sensor of claim 1, wherein the second type semiconductor layer is formed on the first type semiconductor layer.

12. The image sensor of claim 11, wherein the second type semiconductor layer is formed by doping.

13. The image sensor of claim 1, wherein the image sensor is a complementary metal oxide semiconductor (CMOS) image sensor.

14. A method of manufacturing an image sensor comprising:
   forming a first type semiconductor layer including a plurality of pixels which receive external light and convert optical charges into an electrical signal on a semiconductor substrate;
   forming a second type semiconductor layer supplied with a drain voltage to have a potential different from that of the first type semiconductor layer;
   forming a first type well controlling a power source voltage (VDD) using the drain voltage; and
   forming a power source connection element for electrically connecting the power source voltage (VDD) to the second type semiconductor layer.

15. The method of claim 14, wherein the first type semiconductor layer is a P-type semiconductor layer, the second type semiconductor layer is an N+ type semiconductor layer, and the first type well is a P-type well.

16. The method of claim 14, wherein the first type well is formed in a lower portion of the pixel of the first type semiconductor layer.

17. The method of claim 14, wherein the first type well is formed by ion implantation.

18. The method of claim 17, wherein the drain voltage is varied in accordance with an implantation energy of the first type well.

19. The method of claim 18, wherein the first type well controls the drain voltage to be lower than the power source voltage (VDD).

20. The method of claim 14 wherein the power source connection element is formed by being electrically connected to the first type well, and being spaced apart from the second type semiconductor layer.

21. The method of claim 14, wherein the power source connection element is formed by ion implantation.

22. The method of claim 21, wherein the forming of the power source connection element comprises implanting an N-type impurity.

23. The method of claim 14, wherein the image sensor is a complementary metal oxide semiconductor (CMOS) image sensor.

24. An image sensor comprising:
   a first type semiconductor layer including a plurality of pixels which receive external light and convert optical charges into an electrical signal, the first type semiconductor layer is formed on a semiconductor substrate;
   a second type semiconductor layer supplied with a drain voltage to have a potential different from that of the first type semiconductor layer, the second type semiconductor layer is formed on the first type semiconductor layer;
   a first type well controlling a power source voltage (VDD) using the drain voltage, the first type well is formed on the first type semiconductor layer; and
   a power source connection element for electrically connecting the power source voltage (VDD) to the second type semiconductor layer.

* * * * *